United States Patent [19]

Boland

[11] B 4,010,290

[45] Mar. 1, 1977

[54] METHOD OF FABRICATING AN ENSULATED GATE FIELD-EFFECT DEVICE

[75] Inventor: Bernard W. Boland, Scottsdale, Ariz.

[73] Assignee: Motorola, Inc., Chicago, Ill.

[22] Filed: June 20, 1973

[21] Appl. No.: 371,635

[44] Published under the second Trial Voluntary Protest Program on March 23, 1976 as document No. B 371,635.

Related U.S. Application Data

[60] Continuation of Ser. No. 57,401, Sept. 22, 1971, abandoned, which is a division of Ser. No. 740,967, June 28, 1968, abandoned.

[52] U.S. Cl. .................................. 427/93; 427/94
[51] Int. Cl.² ........................................ B05D 5/12
[58] Field of Search ............................ 427/93, 94

[56] References Cited

UNITED STATES PATENTS

| | | | |
|---|---|---|---|
| 3,258,359 | 6/1966 | Hugle | 117/213 |
| 3,331,716 | 7/1967 | Bloem et al. | 148/175 |
| 3,597,667 | 8/1971 | Horn | 317/234 |

OTHER PUBLICATIONS

Bean et al., Some Properties of Vapor Deposited Silicon Nitride Films using the $SiH_4$–$NH_3$–$H_2$ System, In J. Electrochem. Soc. Solid State Science. 114(7), p. 733–732.
Handbook of Chemistry & Physics, 48th Ed., Cleveland, Ohio, Chemical Rubber Co., 1967, p. D58.

*Primary Examiner*—Cameron K. Weiffenbach
*Attorney, Agent, or Firm*—Harry M. Weiss; Lowell E. Clark

[57] ABSTRACT

An insulated gate field-effect transistor is fabricated to include an improved insulation layer comprising a film of silicon dioxide covered with a film of silicon nitride. The method of fabrication includes the thermal oxidation of a semiconductor silicon surface in a "reducing" atmosphere. The use of hydrogen as a carrier gas for oxygen provides a thermally grown, pinhole-free oxide film having improved stability under conditions of heat cycling and electrical bias. The process permits a control of oxidation rate by adjusting the oxygen content of the gaseous mixture, rather than by the control of temperature. Best device characteristics are obtained by proceeding immediately with the vapor deposition of silicon nitride on the oxide, as a substantially continuous operation in the same reactor.

5 Claims, 4 Drawing Figures

N-CHANNEL ENHANCEMENT

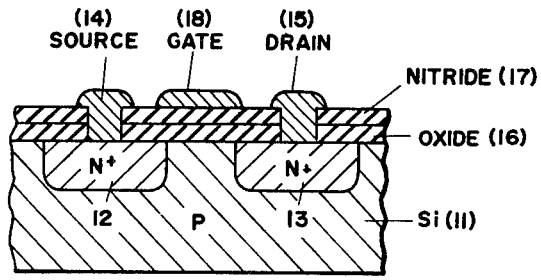
FIG 1 — N-CHANNEL ENHANCEMENT
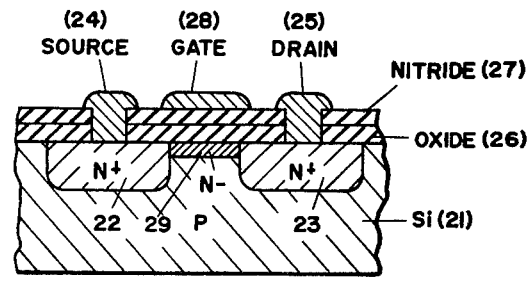
FIG 3 — N-CHANNEL DEPLETION
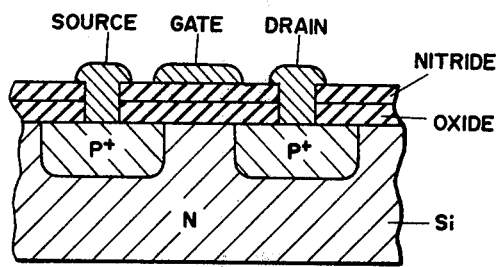
FIG 2 — P-CHANNEL ENHANCEMENT
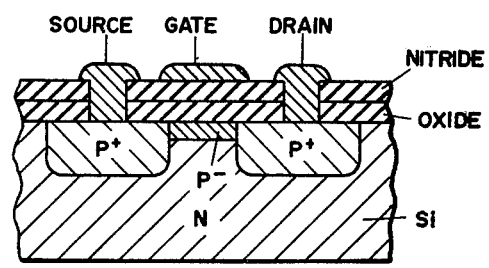
FIG 4 — P-CHANNEL DEPLETION

METHOD OF FABRICATING AN ENSULATED GATE FIELD-EFFECT DEVICE This is a continuation of application Ser. No. 57,401 filed Sept. 22, 1971, now abandoned; which is a division of Ser. No. 740,967, filed June 28, 1968, now abandoned.

BACKGROUND

This invention relates to the fabrication of semiconductor devices, and more particularly to the thermal growth of a stable oxide film or layer on the surface of a semiconductive silicon substrate. In accordance with a specific aspect, the invention relates to the fabrication of an insulated gate field-effect transistor in which the insulation layer comprises a film of silicon dioxide covered with a film of silicon nitride.

In the fabrication of microelectronic silicon devices, the formation of a silicon oxide film at various stages of wafer processing is a very common expedient. Primarily the oxide film is useful to exert a passivating influence on the silicon surface, both during manufacture and thereafter, to stabilize the electronic characteristics of a completed device. The oxide film is also used as a mask for the selective diffusion of conductivity type-determining impurities into the silicon substrate surface.

An early patent directed to various techniques for the controlled oxidation of silicon surfaces is U.S. Pat. No. 2,802,760 issued to Lincoln Derick and Carl Frosch. In one embodiment of the Derick and Frosch disclosure, a monocrystalline silicon wafer is subjected to oxidation at 1200°C in an atmosphere consisting essentially of hydrogen and water vapor. Other embodiments include the use of an atmosphere consisting essentially of nitrogen and water vapor, or an atmosphere consisting essentially of oxygen and nitrogen or helium. The use of hydrogen as a carrier for oxygen was presumably unthinkable, due to its well-known character as a reducing agent, or perhaps due more simply to a fear of explosions. The oxide layer grown in accordance with such processes are subject to substantial deterioration under prolonged heat cycling. Moreover, such layers have an objectionable susceptibility to gradual change in electrical character under the influence of electrical bias. A migration of sodium ions or other contaminants to the siliconsilicon dioxide interface is presumably responsible for such change.

These adverse effects of sodium ion contamination are particularly severe in a silicon dioxide passivated insulated gate field-effect transistor. For example, if an N-channel MOSFET is operated with a continuous positive gate voltage--in the "on" state--the sodium ions begin to migrate. Since the ions are positive, a positive gate voltage drives them to the silicon dioxide-silicon interface. If the applied voltage is now reduced below the gate threshold, the induced N-channel should disappear. However, the layer of positive sodium ions adjacent the interface attracts a number of electrons to the silicon side of the interface. As a result the threshold voltage of such a device is substantially reduced. Thus, sodium ion contamination in the oxide layer renders the actual gate threshold unpredictable and dependent upon the previous history of the device.

THE INVENTION

Accordingly, it is a primary object of the present invention to provide a process for the controlled oxidation of a semiconductive silicon surface to provide a silicon dioxidesilicon interface improved stability.

It is a further object of the invention to provide a process for such oxidation which is readily adaptable to rate control independently of temperature.

A more specific object of the invention is to provide an improved silicon dioxide insulated gate field-effect transistor having excellent electrical stability, particularly with respect to the exclusion of sodium ion contamination. It is a further object of the invention to provide an improved process for the fabrication of such a device.

A primary feature of the invention is the combination of a silicon dioxide film covered by a silicon nitride film as the insulation layer in an isolated gate field-effect transistor. Special precaution is necessary to exclude sodium contamination from the oxide layer during growth, and to deposit a film of silicon nitride thereon to seal the silicon dioxide film from subsequent contamination by sodium ions.

A specific feature of the invention is the use of hydrogen as a carrier gas for oxygen in a process for the thermal oxidation of a silicon surface. An additional feature of the invention involves the adjustment of oxygen content in the reaction gases as a means of controlling oxidation rate, independently of temperature, when using a mixture of hydrogen and oxygen to form an oxide film on a silicon substrate. An additional feature of the invention lies in the step of proceeding immediately with the deposition of silicon nitride over the silicon dioxide film, in the same reactor, as a continuation of the same operation substantially without interruption.

It has now been found that the stability of a thermally grown silicon oxide film is substantially improved by conducting the oxide growth in an atmosphere consisting essentially of hydrogen plus oxygen. Oxide films grown in an oxygen-hydrogen atmosphere have shown a substantially increased resistance to deterioration under conditions of extreme heat cycling and electrical bias. This technique is particularly useful in the fabrication of insulated gate field-effect transistors, since commercial supplies of hydrogen and oxygen are available having extreme purity and freedom from sodium ion contamination. Moreover, the technique permits the use of an open-tube, cold-wall reactor such as an induction-heated tubular quartz furnace, including for example, a graphit or molybdenum susceptor surrounded by an induction coil energized with a radio frequency oscillator. The primary advantage of such an approach lies in the ability to proceed immediately with the deposition of silicon nitride on a silicon dioxide layer in the same furnace without removal or cooling of the substrate wafers, by simply switching from oxygen input to silane plus ammonia input with the same hydrogen ambient.

The invention is also embodied in an insulated gate fieldeffect transistor comprising a semiconductive silicon body of one conductivity type having a source and a drain region therein of opposite conductivity type. A layer of silicon dioxide covers the active surface of the silicon body, including the surfaces of the source and drain regions. A film of silicon nitride covers the silicon dioxide layer to exclude sodium ions and other contaminants therefrom.

A specific aspect of the invention is embodied in a method for the thermal growth of an oxide layer on a silicon substrate which comprises passing a mixture of oxygen and hydrogen in contact with the substrate while maintaining the substrate at a temperature between 800° and 1400°C. It is essential, of course, to maintain the oxygen content of the gaseous mixture below the combustible limit of about 4 percent. Oxygen concentrations as low as 0.5 percent by volume are sufficient to provide practical growth rates, particularly at temperatures in excess of 800°C. Preferred conditions include an oxygen content between 0.5 and 3.0 volume per cent, and a temperature between 1,000°C and 1300°C.

In accordance with a further aspect of the invention, the rate of oxide growth is readily controlled by adjusting the volume percentages concentration of oxygen in the gaseous mixture. For example, at a temperature 1000°C the rate of oxide growth can be controlled within the range of 50 angstroms of thickness per hour to 1000 angstroms per hour by adjusting the oxygen concentration within the range of 0.1 percent up to 4.0 percent.

In the fabrication of a MOSFET device the growth of silicon dioxide is followed by the pyrolitic deposition of silicon nitride by passing a mixture of hydrogen, silane and ammonia in contact with the oxide and substrate while the latter is maintained at a temperature between 800° and 1100°C. A molar ratio of hydrogen to silane in excess of 1000 to 1, and a molar ratio of ammonia to silane between 60 to 1 and 200 to 1, is maintained. Other processes for the deposition of silicon nitride may also be used without departing from the scope of the invention.

A suitable example of apparatus to be used in the practice of the invention is an induction-heated tubular quartz furnace such as that typically employed for the epitaxial growth of semiconductor materials. The system generally consists of a quartz reaction chamber including therein a graphite or molybdenum succeptor surrounded by an induction coil energized by a radio frequency oscillator. The substrate material on which the oxide layer is to be grown is placed upon the susceptor which is heated by radiation from the inductor coil. The apparatus also includes a system of connecting lines and valves for the control flow rates of gases charged to the reaction chamber. As example of such apparatus is disclosed in U.S. Pat. No. 3,243,323 to D. J. Corrigan et al.

DRAWINGS

FIGS. 1 through 4 are greatly enlarged cross-sectional views representing four distinct embodiments of the invention. Each of the embodiments shown is an insulated gate field-effect transistor. FIG. 1 is an N-channel enhancement mode device; FIG. 2 is a P-channel enhancement mode device; FIG. 3 is an N-channel depletion mode device; and FIG. 4 is a P-channel depletion mode device.

The device of FIG. 1, for example, consists of a P-type silicon substrate 11 having diffused N-type source and drain regions 12 and 13 of low resistivity. Ohmic contact thereto is provided by source and drain electrodes 14 and 15, respectively. In accordance with the present invention, the structure includes oxide layer 16 covered by silicon nitride layer 17. Gate electrode 18 is provided in accordance with known techniques and principles.

Most devices of this type have an insulation layer of oxide alone, instead of the combined oxide-nitride layer of the present invention. Attempts have also been made to substitute silicon nitride as the sole insulation layer, thus omitting the oxide altogether. As noted above, the oxide along is inadequate because of its permeability to sodium ions and consequent electrical instability. The nitride alone is unsatisfactory because the silicon nitride-silicon interface does not provide the desired device characteristics.

Although the oxide and nitride layers may be formed in accordance with known techniques to obtain a significant benefit in accordance with the invention, substantially greater improvements in device characteristics are obtained by fabricating the device in accordance with the preferred process aspects of the invention.

Primarily, the essential features of the process embodiment include (1) the use of a hydrogen ambient in forming the oxide layer by thermal oxidation of the silicon surface, and (2) the step of following the oxide growth with silicon nitride deposition as a part of one substantially continuous operation in the same reactor.

The device of FIG. 2 is identical to the device of FIG. 1, except for a reversal of conductivity types within the silicon substrate, thereby providing a P-channel enhancement mode device. The oxide and nitride layers of this embodiment are formed in the same manner and for the same purpose as with the embodiment of FIG. 1.

The device of FIG. 3 consists of a P-type silicon substrate 21 having diffused N-type source and drain regions 22 and 23 of low resistivity. Ohmic contact thereto is provided by source and drain electrodes 24 and 25, respectively. In accordance with the present invention, the structure includes oxide layer 26 covered by silicon nitride layer 27. Gate electrode 28 is provided in accordance with known techniques.

The embodiment of FIG. 3 differs from the embodiment of FIG. 1 in the addition of a lightly doped N-type diffused channel 29 connecting the source and drain regions, thereby providing an N-channel depletion mode device. The oxide and nitride layers are provided in the same manner as with the remaining embodiments, for the same purpose.

The device of FIG. 4 differs from the embodiment of FIG. 2 primarily in the addition of a lightly doped P-type channel extending from the source to the drain region, thereby providing P-channel depletion mode operation. The oxide and nitride layers are formed in the same manner as before, and for the same purpose.

Extensive reliability testing of the silicon nitride passivated MOSFETs of the invention have shown these devices to exhibit less than 60C millivolts shift in threshold after 1000 hours operation. Similar devices in which oxide alone is employed for insulation and passivation show typical threshold voltage shifts up to 6 volts, even under less stringent test conditions. The test conditions for 1000 hours operation include a gate bias voltage greater than the rated maximum, and an ambient temperature of 200°C.

While the primary advantage of the invention is the improved stability in threshold voltage, an increase in the allowable gate voltages has also been realized as an added advantage. Whereas ± 15 volts has been a typical maximum gate voltage, the devices of the invention are rated a ± 50 volts. The improvement in gate voltage results primarily from a greater uniformity of the passivating layer achieved with the process.

The thickness of the oxide layer is not particularly critical. Typically a thickness between 100 angstroms and 5000 angstroms is used; preferably from 500 to 3000 angstroms. Similarly, the nitride layer thickness typically lies between 50 angstroms and about 2000 angstroms. A substantially thicker nitride layer can be used, but with little additional protection from sodium contamination.

I claim:

1. A method for the thermal growth of an oxide layer on a silicon substrate which comprises passing a mixture which consists essentially of oxygen and hydrogen, in which the percentage of oxygen in the mixture is maintained within the range of 0.1% up to 4.0% by volume in contact with the substrate while maintaining the substrate at a temperature between 800°C and 1400°C.

2. A method for the manufacture of an insulated gate field-effect transistor which includes thermal growth of an oxide layer on a silicon substrate comprising the steps of:

passing a mixture of oxygen and hydrogen, in which the percentage of oxygen in the mixture is maintained within the range of 0.1% up to 4.0% by volume, in contact with the substrate while maintaining the substrate at a temperature between 800°C and 1400°C;

forming a silicon nitride layer by pyrolytic deposition on the oxide layer by passing a mixture of hydrogen, silane and ammonia in contact with the oxide and substrate while maintaining the latter at a temperature between 800°C and 1100°C.

3. A method for the fabrication of an insulated gate field-effect transistor having an oxide-nitride layer on a semiconductor body comprising the steps of:

providing a semiconductive silicon substrate in a closed reaction chamber;

growing a thermal oxide layer on said substrate by passing a mixture which consists essentially of oxygen and hydrogen in contact therewith while maintaining the substrate at a temperature between 800°C and 1400°C and maintaining the percentage of oxygen in the mixture within the range of 0.1% up to 4.0% by volume; and without removing said oxide and substrate from said chamber, depositing a layer of silicon nitride on said thermal oxide layer by passing a mixture of hydrogen, silane and ammonia in contact with the oxide and substrate while maintaining the oxide and substrate at a temperature between 800°C and 1100°C.

4. A method for the manufacture of an oxide-nitride layer on a silicon semiconductor substrate, comprising the steps of:

passing a mixture which consists essentially of oxygen and hydrogen, in which the percentage of oxygen in the mixture is maintained within the range of 0.1% up to 4.0% by volume, in contact with the substrate while maintaining the substrate at a temperature between 800°C and 1400°C;

forming a silicon nitride layer by pyrolytic deposition on the oxide layer by passing a mixture of hydrogen, silane and ammonia in contact with the oxide and substrate while maintaining the latter at a temperature 800°C and 1100°C.

5. A method for forming an oxide-nitride layer on a semiconductor body comprising the steps of:

providing a semiconductive substrate in a closed reaction chamber;

growing a thermal oxide layer on said substrate by passing a mixture which consists essentially of oxygen and hydrogen in contact therewith while maintaining the substrate at a temperature between 800°C and 1400°C and maintaining the percentage of oxygen in the mixture within the range of 0.1% up to 4.0% by volume; and without removing said oxide and substrate from said chamber, depositing a layer of silicon nitride on said thermal oxide layer by passing a mixture of hydrogen, silane and ammonia in contact with the oxide and substrate while maintaining the oxide and substrate at a temperature between 800°C and 1100°C.

* * * * *